(12) United States Patent
Torres, Jr. et al.

(10) Patent No.: US 10,381,506 B1
(45) Date of Patent: Aug. 13, 2019

(54) VOLTAGE-TUNABLE WAVELENGTH-AGILE 2D MATERIAL-BASED LIGHT-EMITTING TRANSISTORS

(71) Applicant: SPAWAR Systems Center Pacific, San Diego, CA (US)

(72) Inventors: Carlos M. Torres, Jr., San Diego, CA (US); James R. Adleman, San Diego, CA (US); Ryan P. Lu, San Diego, CA (US); Ayax D. Ramirez, Chula Vista, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/987,479

(22) Filed: May 23, 2018

(51) Int. Cl.
*H01L 33/00* (2010.01)
*H01L 33/34* (2010.01)
(Continued)

(52) U.S. Cl.
CPC ........ *H01L 33/0041* (2013.01); *H01L 31/032* (2013.01); *H01L 31/112* (2013.01); *H01L 33/26* (2013.01)

(58) Field of Classification Search
CPC ............... H01L 51/0043; H01L 51/052; H01L 29/1606; H01L 29/4908; H01L 33/0041;
(Continued)

(56) References Cited

U.S. PATENT DOCUMENTS

| 7,999,020 B2 * | 8/2011 | Frisbie | .............. C08F 293/00 257/40 |
| 9,570,694 B2 | 2/2017 | Sajed | |

(Continued)

OTHER PUBLICATIONS

Torres Jr., Carlos Manuel, Vertical Tunneling Hot Carrier Transport in 2D van der Waals Material-Based Devices for Optoelectronic Applications, Jun. 2, 2015, UCLA PhD Dissertation, pp. 1-105. (Year: 2015).*

(Continued)

*Primary Examiner* — Jonathan Han
(74) *Attorney, Agent, or Firm* — Naval Information Warfare Center, Pacific; Kyle Eppele

(57) ABSTRACT

An optoelectronic device is provided that includes a doped substrate, a tunneling barrier, a direct bandgap two dimensional semiconductor material, a hot electron emitter, a gate electrode, and a voltage bias. The hot electron emitter injects hot electrons from the underlying substrate into the conduction band of the direct bandgap two dimensional semiconductor material via quantum tunneling. The gate electrode is operable to provide the voltage bias in a direction normal to the X-Y plane of the direct bandgap two dimensional semiconductor material so as to generate an electric field perpendicular to the direct bandgap two dimensional semiconductor material. The voltage bias provided by the gate is operable to change an optical bandgap of the direct bandgap two dimensional semiconductor material continuously from the visible to the mid-infrared spectral regime via an electric dipole layer enhanced Giant Stark Effect for electrically-tunable hot electron luminescence applications.

20 Claims, 11 Drawing Sheets

(51) Int. Cl.
*H05B 33/08* (2006.01)
*H01L 31/112* (2006.01)
*H01L 31/032* (2006.01)
*H01L 33/26* (2010.01)

(58) Field of Classification Search
CPC ..... H01L 33/0045; H01L 33/06; H01L 33/08; H01L 33/18
USPC ........................................ 257/13, 40; 362/84
See application file for complete search history.

(56) References Cited

U.S. PATENT DOCUMENTS 9,748,473 B2 8/2017 Willett
9,882,074 B2 1/2018 Yang et al.
9,899,473 B2 2/2018 Oh et al.

OTHER PUBLICATIONS

U.S. Appl. No. 62/428,113, Torres et al.
C. M. Torres Jr., "Vertical Tunneling Hot Carrier Transport in 2D van der Waals Material-Based Devices for Optoelectronic Applications," UCLA PhD Dissertation, (Jun. 2, 2015).
E. V. Castro et at., "Biased Bilayer Graphene: Semiconductor with a Gap Tunable by the Electric Field Effect," Physical Review Letters, 99, 216502 (2007).
J.H. Cho et al., "Printable Ion-Gel Gate Dielectrics for Low-Voltage Polymer Thin-Film Transistors on Plastic," Nature Materials, 7, 900-906 (2008).
A. Ramasubramaniam et al., "Tunable Bandgaps in Bilayer Transition-Metal Dichalcogenides." Physical Review, 84, 205325 (2011).
J. Pu et al., "Highly Flexible MoS2 Thin-Film Transistors with Ion Gel Dielectrics," Nano Letters, 12(8), 4013-4017 (2012).
L. Britnell et al., "Strong Light-Matter Interactions in Heterostructures of Atomically Thin Flims," Science, 340, 1311-1314 (2013).
H. Rostami et al., "Effective Lattice Hamiltonian for Monolayer MoS2—Tailoring Electronic Structure with Perpendicular . . . ," Physical Review B, 88, 085440, (2013).
J. Kim et at., "Observation of Tunable Bandgap and Anisotropic Dirac Semimetal State in Black Phosphorous," Science, 349, 723 (2015).
F. Withers at al., "Light-Emitting Diodes, by Band-Structure Engineering in van der Waals Heterostructures," Nature Materials; 14, 301-306 (2015).
C. M. Torres Jr. et al., "High-Current Gain Two-Dimensional MoS2-Base Hot-Electron Transistors," Nano Letters, 15, 12, 7905-7912 (2015).
Y. Lan, et al., "Dual-Mode Operation of 2D Material-Base Hot Electron Transistors," Scientific Reports, 6, 32503 (2016).
J. Klein et al., "Stark Effect Sctrcecooyof Mono- and Few-Layer MoS2," Nano Letters, 16, 1554-1559 (2016).

* cited by examiner

VOLTAGE-TUNABLE WAVELENGTH-AGILE 2D MATERIAL-BASED LIGHT-EMITTING TRANSISTORS

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 106,251.

BACKGROUND OF THE INVENTION

The present invention is generally drawn to optoelectric emitters and optoelectric detectors. Optoelectric emitters and optoelectric detectors are used for many purposes, including communications (e.g. optical interconnects, on-chip integrated photonic components) in both the civilian world and the military world. Some optoelectric emitters and optoelectric detectors have a small spectrum of operation, whereas others have a relatively broad spectrum of operation. Further, some are tunable over a spectral range. However, conventional optoelectric emitters and optoelectric detectors based on 3D bulk semiconductors are not tunable with sufficient precision to be reliably used for some military purposes. Graphene, mankind's first truly isolated 2D crystal, is a unique and promising material for tunable light-matter interactions due to its gate-variable optical transitions. Its discovery and peculiar properties caused a paradigm shift in material science and naturally led to the search for other 2D monolayer semiconductors called transition metal dichalcogenides (TMDs) and 2D insulators such as hexagonal boron nitride. Several recent publications have demonstrated non-negligible light-emission (e.g. hot electron luminescence) from graphene and hexagonal boron nitride via the quantum tunneling of hot electrons as well as light emission from $MoS_2$ and the Stark Effect bandgap reduction in $MoS_2$, albeit this Stark shift was relative small (e.g. 16 meV) and existed only at cryogenic temperatures (e.g. 10K). Also, a tunable bandgap was realized in bilayer graphene, but is fundamentally limited to <0.3 eV change in bandgap due to its band structure. However, scalable, CMOS-compatible, voltage-tunable wavelength-agile photon emission from these 2D materials at room temperature currently does not exist. The realization of such a unique capability would present an asymmetric advantage to the warfighter because unlike 2D materials, conventional bulk semiconductor materials feature a known, limited, and static spectral range for photoemission and photodetection (e.g. due to the bulk semiconductor materials' fixed bandgaps). By exploiting the widely-tunable direct bandgaps in 2D materials, the warfighter could continuously tune (e.g. in-situ via voltage) the frequency of his or her emitter/detector and thus achieve spectrum dominance over the enemy. That is, the warfighter would be able to communicate/operate in spectral regions where their enemies are unable to since the enemies would be using commercial emitters/detectors based on bulk semiconductors with fixed bandgaps and spectral regions. With our innovative ion-gel 2D-LET device structure, we expect a much larger shift in the direct bandgaps of 2D TMDs such as $MoS_2$, as well as a much larger photon wavelength-agile response from the visible to the mid-infrared spectral regimes at room temperature. This is due to the nanometer thick electric dipole layer that forms in the vicinity of the 2D material's surface via ion-gel gating, which leads to stronger perturbing electric fields and hence an enhanced giant Stark Effect at room temperature.

Accordingly, for at least the foregoing reasons there exists a need for an optoelectronic device that is capable of emitting light over a broad spectral range from the visible to the mid-infrared.

SUMMARY OF THE INVENTION

Embodiments of the invention relate to a light emitting transistor (LET) that uses a two dimensional (2D) material and ion gel top gate dielectric that enables dynamic voltage controlled wavelength agile light emission spanning from the visible to the mid-infrared spectrum.

A 2D LET enables disruptive technological advantages for the Naval Future Force such as low cost, personal, flexible, transparent, and wearable optoelectronic augmentations to soldiers and unmanned aerial vehicles in order to promote information warfare, situational awareness, spectrum dominance, and Command, Control, Communications, Computers, Intelligence, Surveillance, and Reconnaissance (C4ISR).

An aspect of the present invention is drawn to an optoelectronic device that includes a doped substrate, a tunneling barrier, a direct bandgap two dimensional semiconductor material, a hot electron emitter, a gate electrode, and a voltage bias. The gate electrode is operable to provide the voltage bias in a direction normal to the X-Y plane of the direct bandgap two dimensional semiconductor material so as to generate an electric field perpendicular to the direct bandgap two dimensional semiconductor material. The voltage bias provided by the gate is operable to change an optical bandgap of the direct bandgap two dimensional semiconductor material via a giant Stark Effect from the visible to the mid-infrared spectrum.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Aspects of the present invention are drawn to a system and method for using a 2D material and ion gel top gate electric to enable voltage controlled wavelength agile light emission.

In accordance with a first aspect of the present invention a highly doped substrate, which serves as the hot electron emitter, is provided along with a tunneling barrier stacked on top of the substrate, and a 2D semiconductor material stacked on top of the tunneling barrier. Next, a top gate dielectric material is stacked on top of the semiconductor material and finally a collector layer is disposed on top.

An emitter-base voltage ($V_{EB}$), or similarly a back-gate voltage ($V_{BG}$), is applied to the highly doped substrate such that hot electrons quantum mechanically tunnel from the highly doped substrate, through the tunneling barrier and into the conduction band of the 2D semiconductor material.

As the hot electrons relax within the conduction band of the 2D material, they eventually recombine with holes in the valence band and emit photons with a wavelength near the direct bandgap energy associated with the bandgap of the two dimensional semiconductor material (e.g. hot electron luminescence).

A collector-base voltage ($V_{CB}$) source, or similarly top-gate voltage ($V_{TG}$), may provide a potential difference across the top gate dielectric material and the 2D material as the base region in order to provide an electric field perpendicular to the 2D semiconductor material in order to reduce the band gap of the 2D semiconductor material, via the giant Stark Effect. In this manner, by applying a voltage across the top gate dielectric material it is possible to continuously tune the frequency of the photons emitted by the 2D semiconductor material from the visible to the mid-infrared spectral regime.

Example systems in accordance with the first inventive aspect of the present invention will now be described with reference to FIGS. 1-6.

Figure 1:
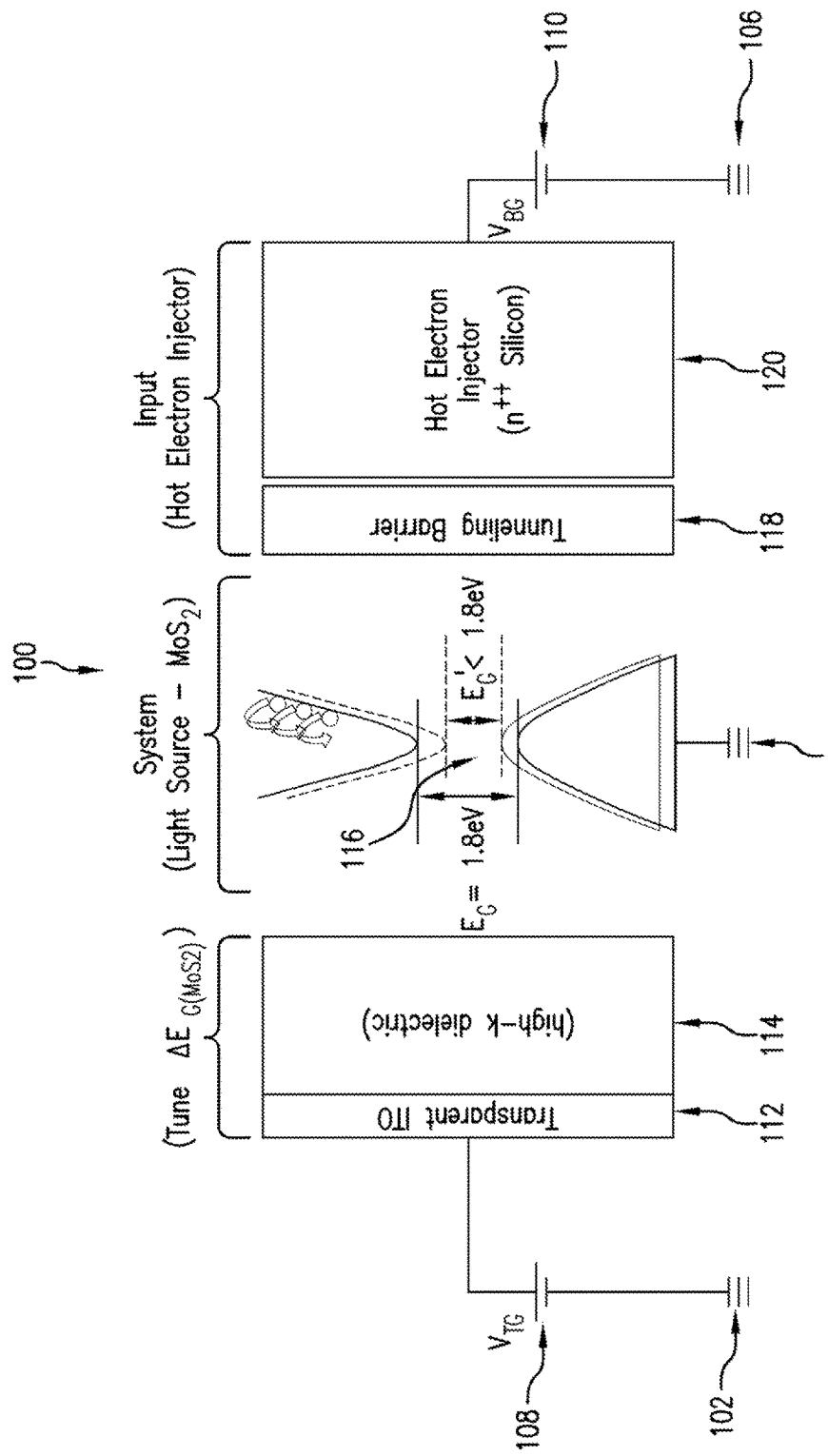
FIG. 1 illustrates a basic device structure and operational procedure of an optoelectronic device in accordance with aspects of the present invention.

FIG. 1 illustrates a basic device structure and operational procedure of an optoelectronic device 100 in accordance with aspects of the present invention.

As illustrated in the figure, optoelectronic device 100 includes ground 102, a base electrode 104, a ground 106, a collector-base voltage ($V_{CB}$) or, in other words, a top-gate voltage ($V_{TG}$) 108, an emitter-base voltage ($V_{EB}$) or, in other words, a back-gate voltage ($V_{BG}$) 110, a collector 112, a top gate dielectric 114, a semiconductor layer 116, a tunneling barrier 118, and a substrate 120.

Ground 102 is operable to provide an electrical ground to $V_{TG}$ 108. Base electrode 104 is arranged to provide an electrical ground to semiconductor layer 116. Ground 106 is operable to provide an electrical ground to $V_{BG}$ 110.

$V_{TG}$ 108 is operable to provide a potential difference across collector 112, top gate dielectric 114, and semiconductor layer 116.

$V_{BG}$ 110 is operable to provide a potential difference across substrate 120, tunneling barrier 118, and semiconductor layer 116.

Collector 112 is operable to receive $V_{TG}$ 108. Collector 112 is additionally transparent in order to allow photons to travel through it. In this example embodiment, collector 112 is made of Indium Tin Oxide (ITO). In other example embodiments, collector 112 may be an ion-gel, ionic-liquid, graphene or combinations thereof.

Top gate dielectric 114 is operable to receive $V_{TG}$ 108. Top gate dielectric 114 is additionally operable to generate an electric field perpendicular to semiconductor layer 116 based on $V_{TG}$ 108. Top gate dielectric 114 is further operable to be transparent in order to allow photons to travel through it. In this example embodiment, top gate dielectric 114 is made of Hafnium Dioxide (HfO$_2$). In other example embodiments, top gate dielectric 114 may be an ion-gel, ionic-liquid, Aluminum Oxide (Al$_2$O$_3$), or a semi-transparent metallic contact such as Titanium/Platinum.

Semiconductor layer 116 is a direct bandgap monolayer two dimensional semiconductor material. Semiconductor layer 116 is additionally operable to receive hot electrons that quantum mechanically tunnel through tunneling barrier 118 from substrate 120. In this example embodiment, semiconductor layer 116 has a direct band gap of 1.8 electron Volts (eV) between its conduction band and valence band in the K point of its Brillouin zone.

In this example embodiment, semiconductor layer 116 is made of Molybdenum Disulfide (MoS$_2$). In other example embodiments, semiconductor layer 116 may be made of Tungsten Disulfide (WS$_2$), Tungsten Diselenide (WSe$_2$), or any other transition metal dichalcogenides, black phosphorous, or combinations thereof.

Tunneling barrier 118 allows hot electrons to be injected via quantum tunneling from the substrate 120 into the conduction band of the semiconductor layer 116. In this example embodiment, tunneling barrier 118 is made of Silicon Dioxide (SiO$_2$), but other embodiments can include monolayer or multilayer hexagonal boron nitride, graphene, Gadolinium Dioxide (Gd$_2$O$_3$), bilayer tunnel barriers, etc.

Substrate 120 is arranged to receive $V_{BG}$ 110. Substrate 120 is a highly doped material such that it has a large amount of electrons. In this example embodiment, substrate 120 is made of degenerately n-doped silicon.

In order for the hot electrons to enter into the conduction band of the semiconductor layer 116 (e.g. the base region), they must quantum mechanically tunnel through the tunneling barrier 118. The width and energy barrier height of the tunneling barrier 118 can be modified by choosing the appropriate materials and these two parameters (e.g. width and energy barrier height of the tunneling barrier 118) exponentially affect the tunneling current magnitude and the subsequent emitted light intensity from the 2D-LET.

The operation of optoelectronic device 100 will now be discussed with additional reference to FIGS. 2A-3.

Figure 2A:
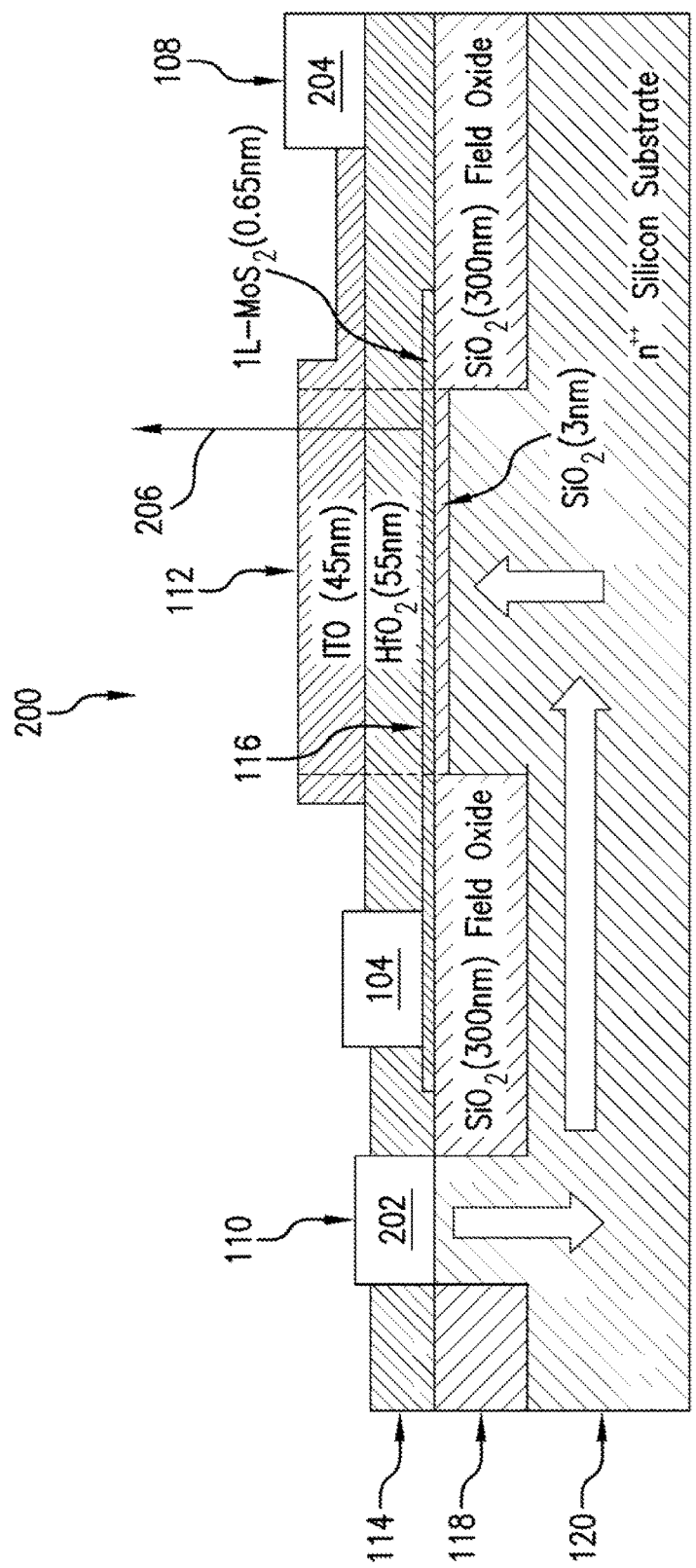
FIG. 2A illustrates a cross sectional view of an optoelectronic device operating as a light emitter in accordance with aspects of the present invention.

FIG. 2A illustrates a cross sectional view 200 of optoelectronic device 100 of FIG. 1 operating as a light emitter in accordance with aspects of the present invention.

As shown in the figure, cross section view 200 contains the same elements of FIG. 1 and additionally includes an emitter electrode 202, a collector electrode 204, a base electrode 104, and a light output signal 206. The operation of elements common between FIG. 1 and FIG. 2A is identical and for purposes of brevity, their operation will not be discussed again.

Emitter electrode 202 provides $V_{BG}$ 110 of FIG. 1, to substrate 120. Collector electrode 204 provides $V_{TG}$ 108 of FIG. 1 to collector 112 and top gate dielectric 114. Base electrode 104 is grounded and serves as the reference potential for the collector-base ($V_{CB}$) voltage and the emitter-base ($V_{EB}$) voltage.

Light 206 is made of photons emitted by semiconductor layer 116 in the active (e.g. base) region of the optoelectronic device 100.

In operation, a negative voltage is applied to substrate 120 as $V_{BG}$ 110, via emitter electrode 202. For purposes of discussion, let substrate 120 be disposed in an X-Y plane and let collector 112 be disposed in another X-Y plane, wherein substrate 120 is generally parallel with collector 112. Additionally, at the start of operation, no voltage is applied across collector 112, top gate dielectric 114, or semiconductor layer 116 as $V_{TG}$ 108, via collector electrode 204.

When a sufficiently negative voltage is applied to the degenerately n-doped substrate 120, the hot electrons within the substrate gain kinetic energy and tunnel through the tunneling barrier 118, either through the Fowler-Nordheim Tunneling or Direct Tunneling mechanisms. Since the tunneling barrier 118 is between the substrate 120 and semiconductor layer 116, the hot electrons are not able to tunnel through the tunneling barrier 118 unless they have enough energy. Once the hot electrons have enough energy to tunnel, they tunnel from the substrate directly into the conduction band of the semiconductor material 116. Without the tunneling barrier 118 in place, a Schottky barrier would form at the degenerately n-doped semiconducting substrate 120 and the semiconductor layer 116 contact.

Referring back to FIG. 1, once the hot electrons tunnel through the tunneling barrier 118, they arrive in the conduction band of semiconductor material 116 with excess kinetic energy.

The hot electrons that tunnel into semiconductor material 116 scatter via various mechanisms (e.g. electron-electron, electron-optical phonon, electron-acoustic phonon) and eventually reach the conduction band edge of the 2D semiconducting material 116. Once at the conduction band edge, the hot electrons radiatively recombine and emit photons with a wavelength corresponding to the direct optical bandgap of the semiconducting material 116.

In this example embodiment the band gap of semiconductor material 116 is 1.8 eV and the wavelength of the emitted photons is 689 nanometers (nm). Since collector 112 and top gate dielectric 114 are made of transparent materials, once emitted, the photons travel out of optoelectronic device 100 as light 206 as shown in FIG. 2A.

Consider, for purposes of discussion, the example embodiment where a tunneling current of $I_{EB}$=1 nA is constantly injected into the conduction band of semiconductor material 116, and where semiconductor material 116 is monolayer $MoS_2$. Such an embodiment would yield about 6 million photons per second emanating from semiconductor material 116. Note that this is calculated from the peak photon energy of the hot electron luminescence (HEL) spectrum, which is centered near the direct bandgap of monolayer $MoS_2$, which is λ=689 nm (e.g., $E_G$=1.8 eV). This is calculated as follows:

$$I=(ne)/t \tag{1}$$

wherein I is the tunneling current, t is time, n is the number of electrons/second and e is the charge of an electron, $1.602 \times 10^{-19}$ C. Equation (1) can be rewritten in terms of n as follows:

$$n=(It)/e \tag{2}$$

Using $I=1 \times 10^{-9}$ A in equation (2), n is calculated as:

$$n=(1 \times 10^{-9} A) \cdot (1s)/(1.602 \times 10^{-19} C)=6.2422 \times 10^9 \text{ electrons/sec} \tag{3}$$

Using the internal quantum efficiency of $MoS_2$ as $10^{-3}$ yields $$(6.2422 \times 10^9 \text{ electrons/sec}) \cdot (10^{-3} \text{ photons/electron}) = 6.2422 \times 10^6 \text{ photons/sec.} \tag{4}$$

The power corresponding to this peak photon emission is:

$$(6.2422 \times 10^6 \text{ photons/sec}) \cdot (1.8 \text{ eV/photon}) = (1.1236 \times 10^7 \text{ eV/sec}) \cdot (1.602 \times 10^{-19} \text{ J/eV}) = 1.8 \times 10^{-12}$$
$$W=1.8 \text{ pW} \tag{5}$$

In this example embodiment, there was no voltage applied across collector 112, top gate dielectric 114, or semiconducting layer 116, via collector electrode 204. In other example embodiments, a voltage may be applied by collector electrode 204 in order to tune the bandgap of semiconductor material 116.

Referring back to FIG. 2A, suppose for example that a negative voltage is now applied across collector 112, top gate dielectric 114, and semiconducting layer 116, as $V_{TG}$ 108, via collector electrode 204. With a voltage applied, top gate dielectric 114 features an electric field that is perpendicular to semiconductor material 116 or normal to the X-Y plane. Since top gate dielectric 114 is on top of semiconductor material 116, the perpendicular electric field reduces the band gap of semiconductor material 116, via the giant Stark Effect.

The relationship between the perpendicular top-gate voltage ($V_{TG}$), or similarly collector-base voltage ($V_{CB}$), and the induced potential ($U_b'$) across the three sublayers of the monolayer $MoS_2$ is given by:

$$U_b'=(d/L)(\epsilon'/\epsilon)eV_{TG}, \tag{6}$$

where ε is the relative dielectric constant of the monolayer $MoS_2$ and d is the thickness of the monolayer $MoS_2$, ε' is the relative dielectric constant of the top-gate dielectric (e.g. $HfO_2$ or ion-gel), and L is the thickness of the top-gate dielectric. The induced potential ($U_b'$) across the sublayers of the monolayer $MoS_2$ may be solved for by inserting a particular top-gate voltage ($V_{TG}$) value and the material parameters of the 2D-LETs featuring $MoS_2$ into equation (6).

Referring back to FIG. 1, the operation of optoelectronic device 100 is identical as described above even with a voltage applied across the top-gate dielectric 114. A negative $V_{BG}$ 110 is applied to substrate 120 via emitter electrode 202 in order to inject hot electrons into the conduction band of semiconductor material 116 via quantum tunneling. After tunneling, the hot electrons begin to relax towards the edge of the conduction band of semiconductor material 116.

Once the hot electrons reach the conduction band edge, they radiatively recombine with holes and the semiconducting material 116 emits photons with a wavelength that is proportional to the band gap of the semiconductor material 116. In this example embodiment, since an electric field is already applied across the top-gate dielectric 114, the direct bandgap of the semiconductor material 116 has been reduced due to the giant Stark Effect which will change the wavelength of the photons emitted by the semiconducting material 116.

Suppose that in this example embodiment that the bandgap of the semiconducting material is reduced from 1.8 eV (e.g. 689 nm; visible) to 1.5 eV (e.g. 827 nm; near-infrared) by the giant Stark Effect and that the wavelength of the emitted photons is 827 nm. Once emitted, the photons travel through the top-gate dielectric 114 and the collector 112 and out of the optoelectronic device 100 as light 206.

In this manner, by applying a collector-base voltage ($V_{CB}$) across the top-gate dielectric 114, the direct band gap of semiconducting material 116 reduces via the giant Stark effect, which allows the wavelength of the photons emitted by the semiconducting material 116 to be tuned from the visible to the near-infrared as well.

In the previous example embodiments, optoelectronic device 100 operated as a light emitter, but in other example embodiments, optoelectronics device 100 may operate as a light detector. Optoelectronics device 100 operating as a light detector will now be described with additional reference to FIG. 2B.

Figure 2B:
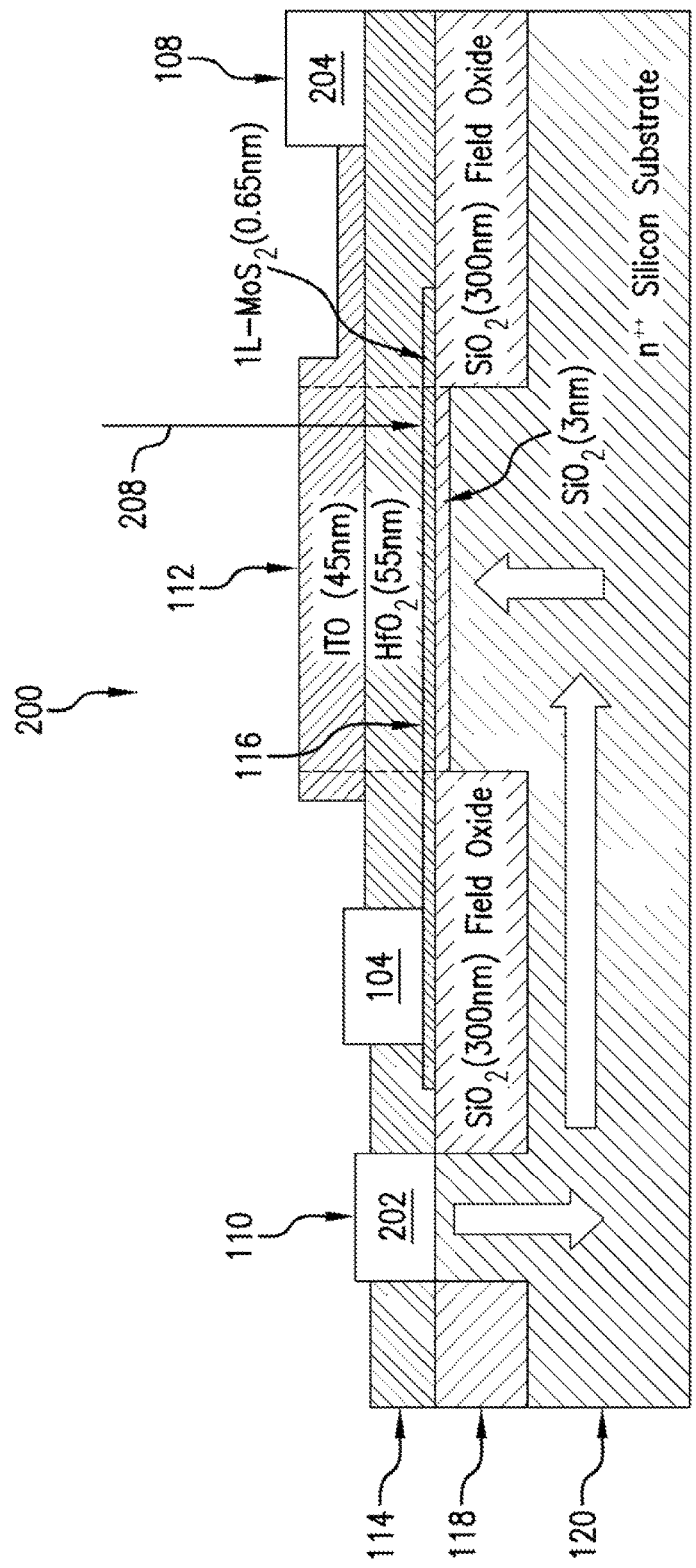
FIG. 2B illustrates a cross sectional view of an optoelectronic device operating as a light detector in accordance with aspects of the present invention.

FIG. 2B illustrates a cross sectional view 200 of optoelectronic device 100 of FIG. 1 operating as a light detector in accordance with aspects of the present invention.

As shown in the figure, cross section view 200 contains the same elements of FIG. 2A and additionally includes light input signal 208. The operation of elements common between FIG. 1 and FIG. 2B is identical and for purposes of brevity, their operation will not be discussed again.

Light 208 is emitted from an external source (not shown) that travels towards optoelectronic device 100.

In operation, optoelectronic device 100 operating as a light detector is similar to that of optoelectronic device 100 operating as a light emitter. To begin, a negative voltage is applied to substrate 120 as $V_{BG}$ 110, via emitter electrode 202, and no collector-base voltage ($V_{CB}$) is applied across collector 112, top gate dielectric 114, or semiconducting material 116, via collector electrode 204. Additionally, assume for purposes of discussion that at the beginning of operation, light 208 is not hitting optoelectronic device 100.

As described above, when a negative $V_{BG}$ is applied to substrate 120, hot electrons tunnel through tunneling barrier 118 and into the conduction band of semiconducting material 116. If the voltage applied by $V_{BG}$ 110 remains constant, the amount of electrons injected by substrate 120 remains constant as well, which can be detected as a constant current once the electrons travel to ground from semiconducting material 116.

Suppose that at this time, light 208 with energy equal to or greater than either the direct bandgap of semiconducting material 116 or the bandgap of the substrate 120 begins hitting optoelectronic device 100. When the photons of light 208 hit optoelectronic device 100, they pass through collector 112, top-gate dielectric 114, semiconducting material 116, tunneling barrier 118, and substrate 120. The photons of light 208 are then absorbed by electrons within either the semiconducting material 116, the substrate 120, or both which generates a photocurrent contribution to the constant tunneling current.

Since the value of $V_{BG}$ 110 is constant, the photoexcited carriers will result in a change in tunneling current. In this manner, any change in current may be used to determine whether or not light has been detected by optoelectronic device 100. Additionally, the different bandgaps of the semiconducting material 116 and the substrate 120 can act as high pass energy filters capable of absorbing incoming photons 208 of sufficient energy to induce a change in the tunneling current.

In the previous example embodiments, collector 112 and top-gate dielectric 114 were discrete layers of different materials. In other example embodiments, collector 112 and top-gate dielectric 114 may be replaced with a single functional layer, for example an ion-gel, which will now be described with reference to FIG. 3.

Figure 3:
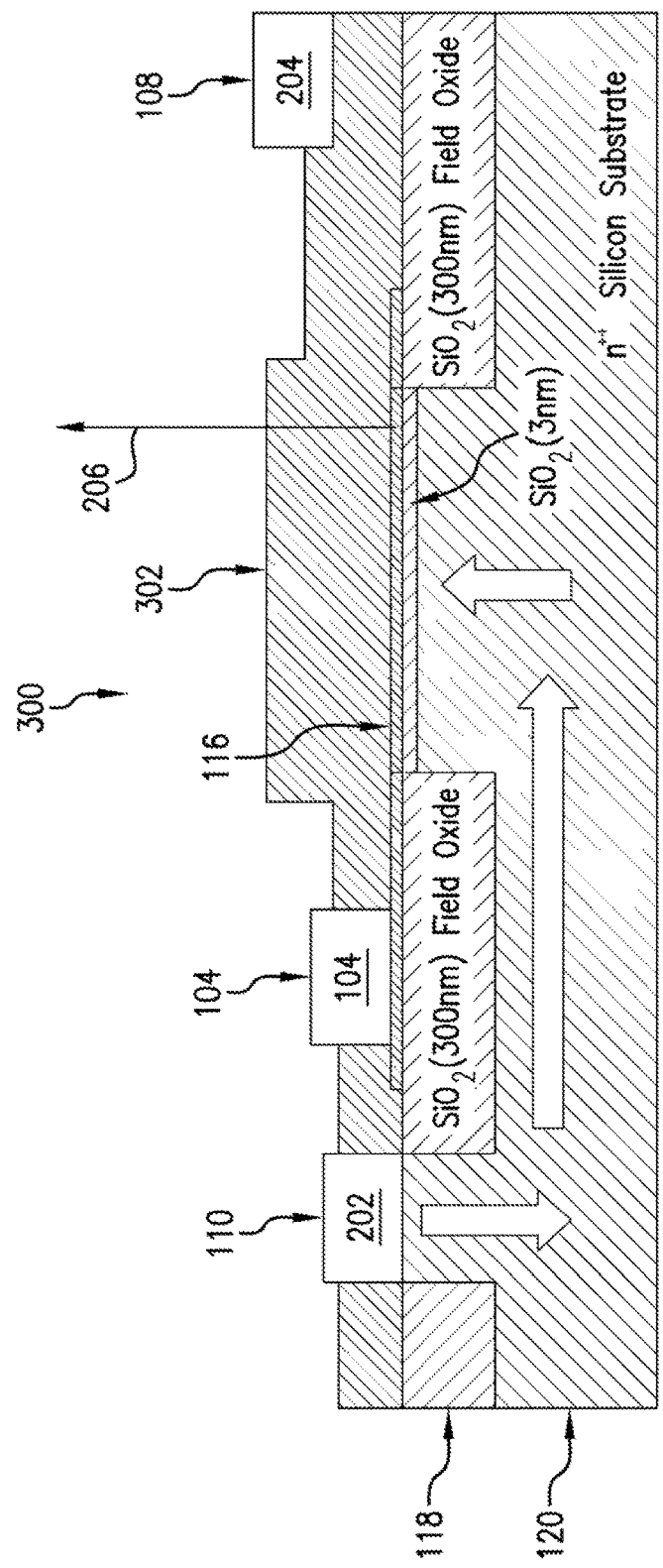
FIG. 3 illustrates a cross sectional view of an optoelectronic device using an ion-gel in accordance with aspects of the present invention.

FIG. 3 illustrates a cross sectional view 300 of optoelectronic device 100 using an ion-gel in accordance with aspects of the present invention.

As illustrated in the figure, cross sectional view 300 includes the same elements of FIG. 2A, with the exception of collector 112 and top-gate dielectric 114, which have been replaced with ion-gel 302. For purposes of brevity, the operation of elements common between FIG. 2A and FIG. 3 will not be described again.

Ion-gel 302 is operable to receive $V_{TG}$ 108 via collector electrode 204. Ion-gel 302 is additionally operable to generate an electric field perpendicular to semiconductor layer 116 based on $V_{TG}$ 108. Ion-gel 302 is further operable to be transparent in order to allow photons to travel through it.

In operation, optoelectronic device 100 operating with an ion-gel is similar to optoelectronic device 100 operating with collector 112 and top-gate dielectric 114. To begin, a negative voltage is applied to substrate 120 as $V_{BG}$ 110, via emitter electrode 202, and no voltage is applied to ion-gel 302.

The negative voltage applied to substrate 120 results in hot electrons tunneling through tunneling barrier 118 and into the conduction band of semiconductor material 116. As described above in FIG. 2A, once the hot electrons tunnel into the semiconducting material 116 the electrons relax to the conduction band edge and radiatively recombine with holes to emit photons where the wavelength of the emitted photons is proportional to the band gap of semiconducting material 116. In this example embodiment the band gap of semiconductor material 116 is 1.8 eV and the wavelength of the emitted photons is 689 nanometers (nm). The emitted photons then travel from semiconducting material 116, through ion-gel 302 and out of optoelectronic device 100 as light 206.

For purposes of discussion, suppose that at some later time, it is desired to emit photons from optoelectronic device 100 at a different frequency. At this point, a voltage is applied to ion-gel 302 as $V_{TG}$ 108, via collector electrode 204. The applied voltage results in ion-gel 302 creating a highly localized electric field perpendicular to the surface of the semiconducting material 116 due to the sub-nanometer electric dipole layer that is induced at the interface between the ion-gel 302 and the semiconducting material 116. The highly confined electric field of ion-gel 302 reduces the band gap of semiconducting material 116 such that its band gap can change from 1.8 eV (e.g. 689 nm; visible at $V_{CB}$=0V) to 0.105 eV (e.g. 11.8 µm; mid-infrared at $V_{CB}$=3V), via the electric dipole layer enhanced giant Stark Effect. These values are attained by inputting realistic material parameters into Equation (6).

At this time, when the hot electrons reach the edge of the conduction band they will radiatively recombine and the semiconducting material 116 will emit a photon with a wavelength that is proportional to a band gap of 0.105 eV rather than 1.8 eV, which in this example embodiment is 11.8 µm. The emitted photons then travel from semiconducting material 116, through ion-gel 302 and out of optoelectronic device 100 as light 206.

In this manner, the frequency of the photons emitted by optoelectronic device 100 may be tuned when an ion-gel is used rather than a collector and top-gate dielectric. Additionally, a much stronger electric field may be generated by an ion-gel when compared to a collector and top-gate dielectric, which allows for a greater change in band gap due to the electric dipole layer enhanced giant Stark Effect. An ion-gel generating an electric field will now be discussed with reference to FIG. 4.

Figure 4:
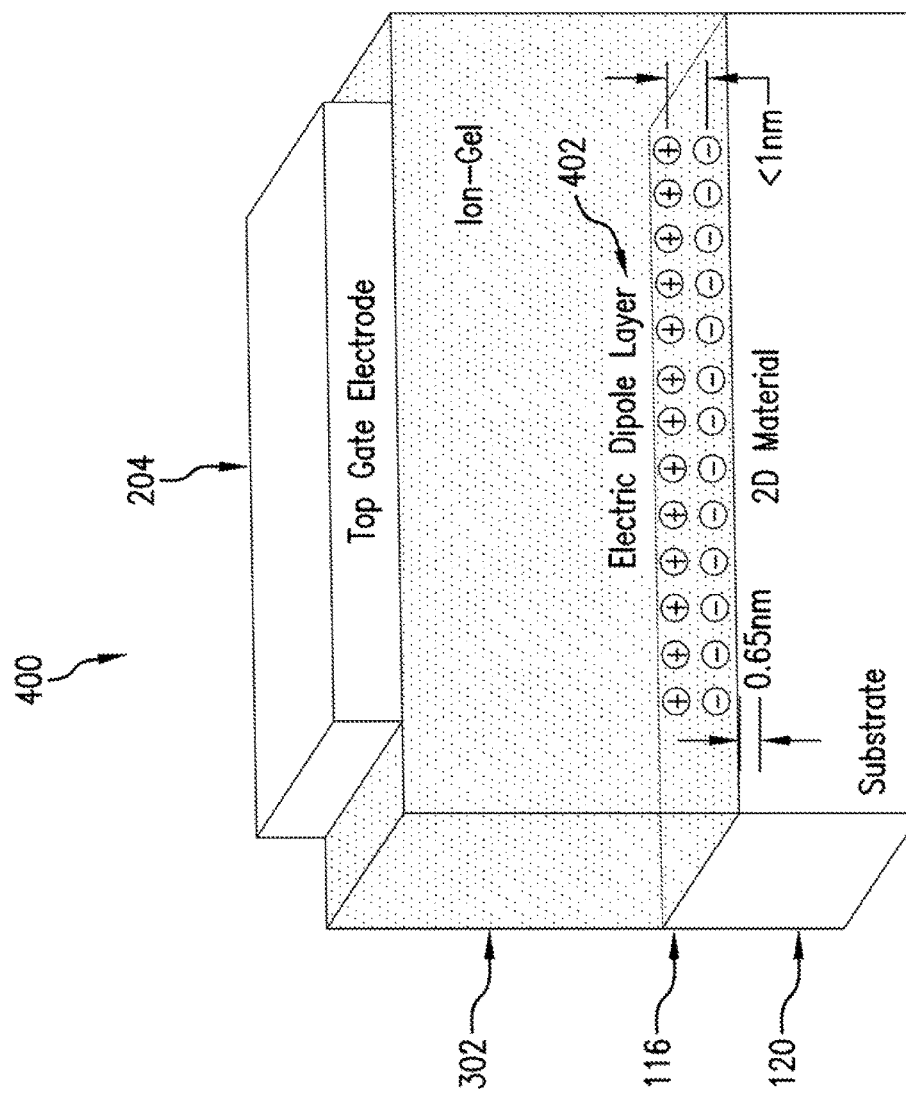
FIG. 4 illustrates an ion-gel forming a sub-nanometer electric dipole layer with a confined electric field in accordance with aspects of the present invention.

FIG. 4 illustrates an isometric view 400 of an ion-gel forming an electric field in accordance with aspects of the present invention.

As shown in the figure, isometric view 400 contains semiconducting material 116, substrate 120, collector electrode 204, ion-gel 302, and an electric dipole layer 402.

Electric dipole layer 402 forms at the boundary between ion-gel 302 and semiconducting material 116 when a voltage is applied to ion-gel 302, via collector electrode 204.

In operation, when a voltage is applied to ion-gel 302 by collector electrode 204, electric dipole layer 402 forms near the surface of semiconducting material 116. Electric dipole layer 402 features a sub-nanometer thickness and concentrates the electric field to the region near the surface of semiconducting material 116. Semiconducting material 116 confines the flow of electrons to two dimensions and feature a lower carrier concentration when compared to bulk semiconductors. These features render 2D materials inherently poor at screening externally applied electric fields and thus their electronic properties and band structures are highly sensitive to external perturbations. In the case of ion-gel 302, the electric field magnitude is so strong that it can significantly reduce the band gap of semiconducting material 116, via the electric dipole layer enhanced giant Stark Effect.

The energy band diagrams of optoelectronic device 100 under different conditions will now be described with reference to FIGS. 5-8.

Figure 5:
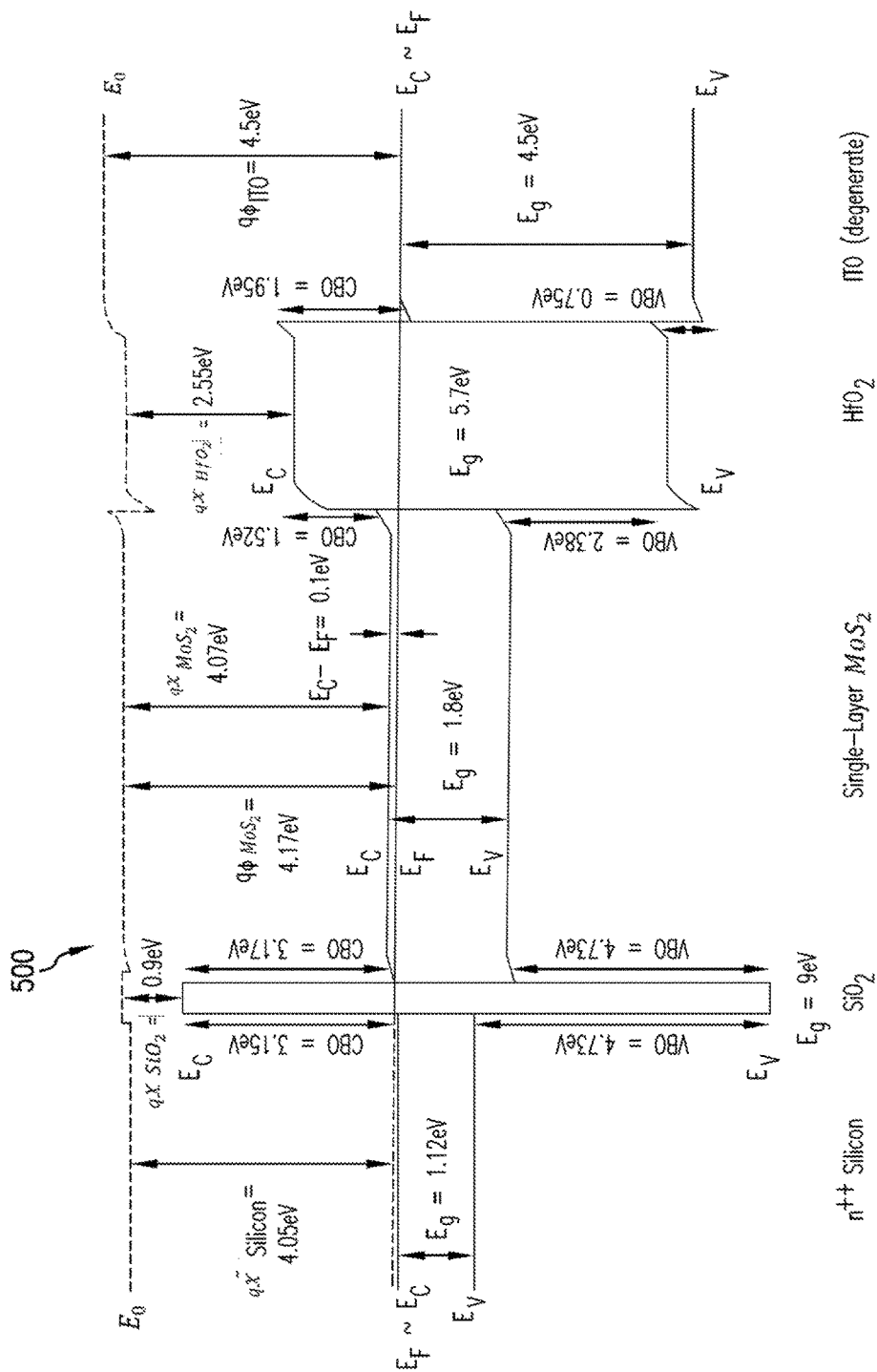
FIG. 5 illustrates an energy band diagram of a 2D-LET with $MoS_2$ as the active (e.g. base) region under thermal equilibrium in accordance with aspects of the present invention.

FIG. 5 illustrates an energy band diagram 500 of optoelectronic device 100 with $MoS_2$ as the active (e.g. base) region under thermal equilibrium in accordance with aspects of the present invention.

Energy band diagram 500 shows the energy band diagram of optoelectronic device 100 when using $MoS_2$ as the material for semiconducting material 116 while under thermal equilibrium. Additionally, energy band diagram 500 shows all of the relevant material parameters which include band gaps, electron affinities, work functions, conduction band offsets, and valence band offsets. Degenerately doped ITO is used as the material for collector 112 in this embodiment of optoelectronic device 100.

Figure 6:
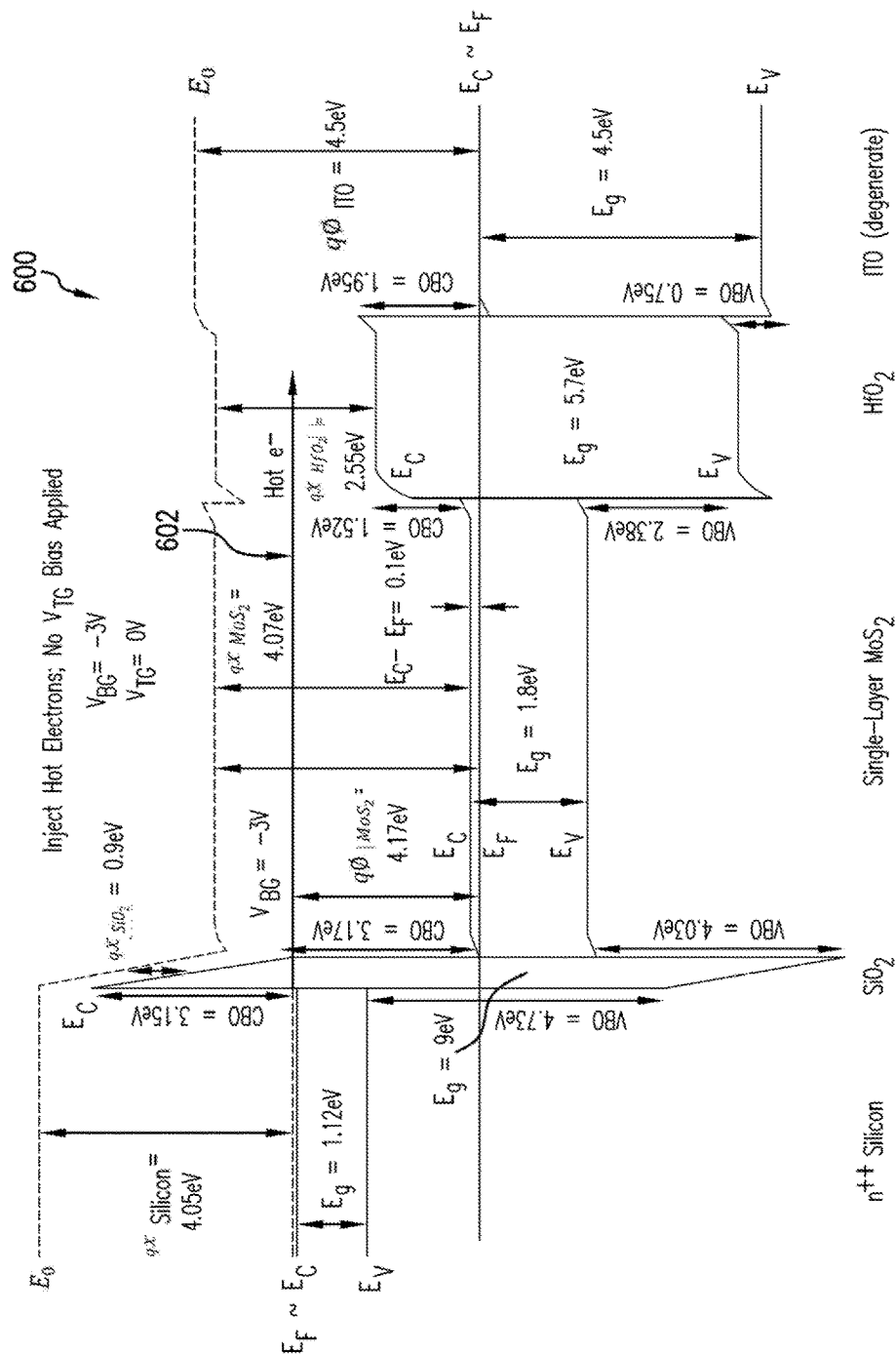
FIG. 6 illustrates an energy band diagram of a 2D-LET with $MoS_2$ as the active (e.g. base) region when a back-gate voltage is applied but no top-gate voltage is applied in accordance with aspects of the present invention.

FIG. 6 illustrates an energy band diagram 600 of optoelectronic device 100 with $MoS_2$ as the active (e.g. base) region when a back-gate voltage is applied but no top-gate voltage is applied in accordance with aspects of the present invention.

Energy band diagram 600 shows the energy band diagram of optoelectronic device 100 when using $MoS_2$ as the material for semiconducting material 116 while $V_{BG}$ 110 is applied with a voltage of −3 Volts and $V_{TG}$ 108 has a voltage of 0 Volts. Energy band diagram 600 shows all of the relevant material parameters which include band gaps, electron affinities, work functions, conduction band offsets, and valence band offsets. Degenerately doped ITO is used as the material for collector 112 in this embodiment of optoelectronic device 100. Line 602 shows the vertically tunneling hot electrons which are injected from substrate 120 into the conduction band of semiconducting material 116 through tunneling barrier 118.

Figure 7:
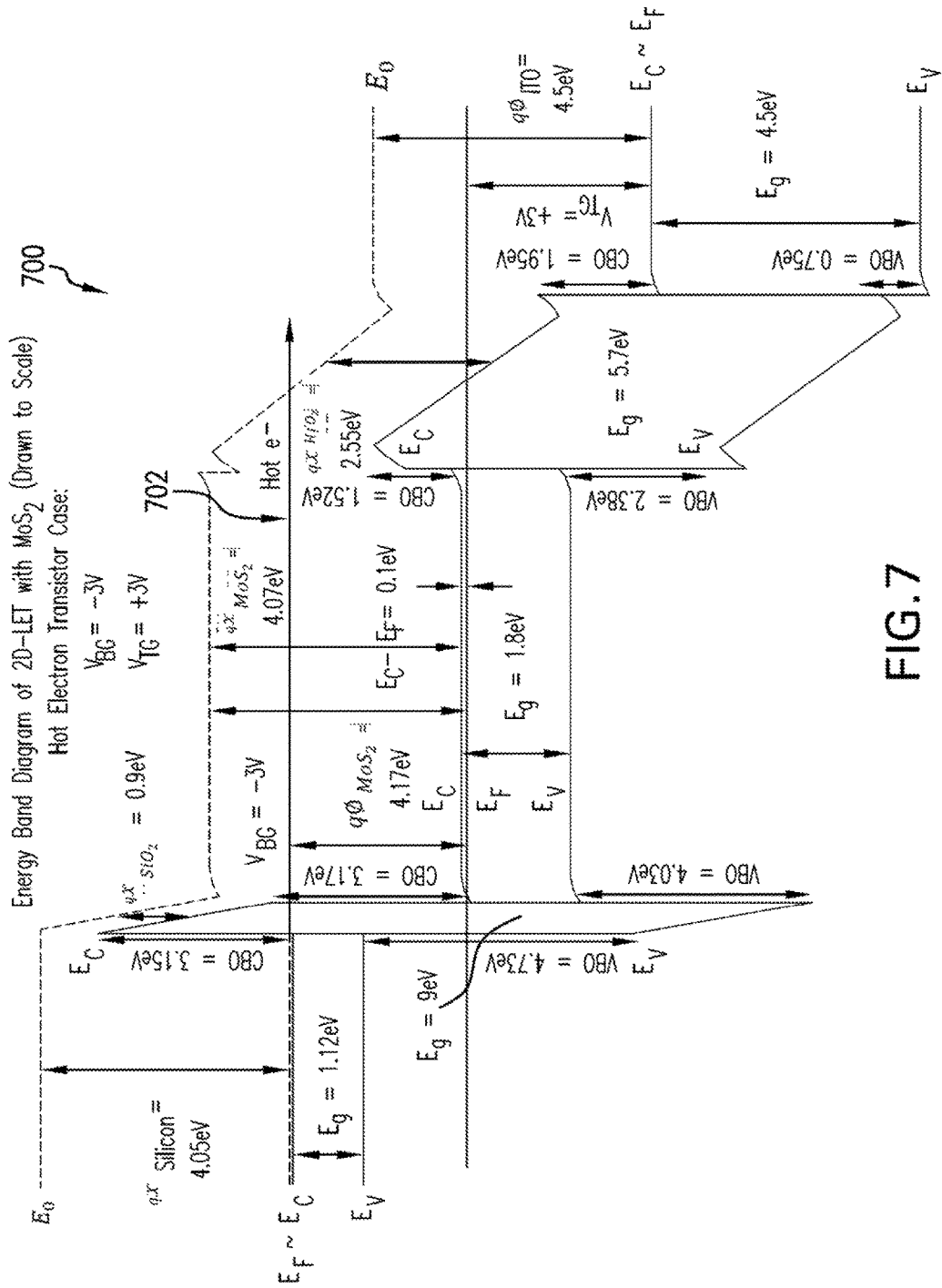
FIG. 7 illustrates an energy band diagram of a 2D-LET with MoS$_2$ as the active (e.g. base) region under the biasing conditions where the device operates as a hot electron transistor in accordance with aspects of the present invention.

FIG. 7 illustrates an energy band diagram 700 of optoelectronic device 100 with $MoS_2$ as the active (e.g. base) region under the biasing conditions where the device operates as a hot electron transistor in accordance with aspects of the present invention.

Energy band diagram 700 shows the energy band diagram of optoelectronic device 100 when using $MoS_2$ as the material for semiconducting material 116 when $V_{BG}$ 110 is applied with a voltage of −3 Volts and $V_{TG}$ 108 has a voltage of +3 Volts. Additionally, energy band diagram 700 shows all of the relevant material parameters which include band gaps, electron affinities, work functions, conduction band offsets, and valence band offsets. Degenerately doped ITO is used as the material for collector 112 in this embodiment of optoelectronic device 100. Line 702 indicates the vertically tunneling hot electrons which are injected from substrate 120 into conduction band of semiconducting material 116 through tunneling barrier 118. Since the potential energy barrier (e.g. filter barrier at the base-collector interface) is lowered with an applied positive $V_{TG}$ ($V_{TG}$>0) 108, the hot electrons can transmit and reach the ITO collector electrode. This mode of operation of the 2D-LET is typical for hot electron transistors.

Figure 8:
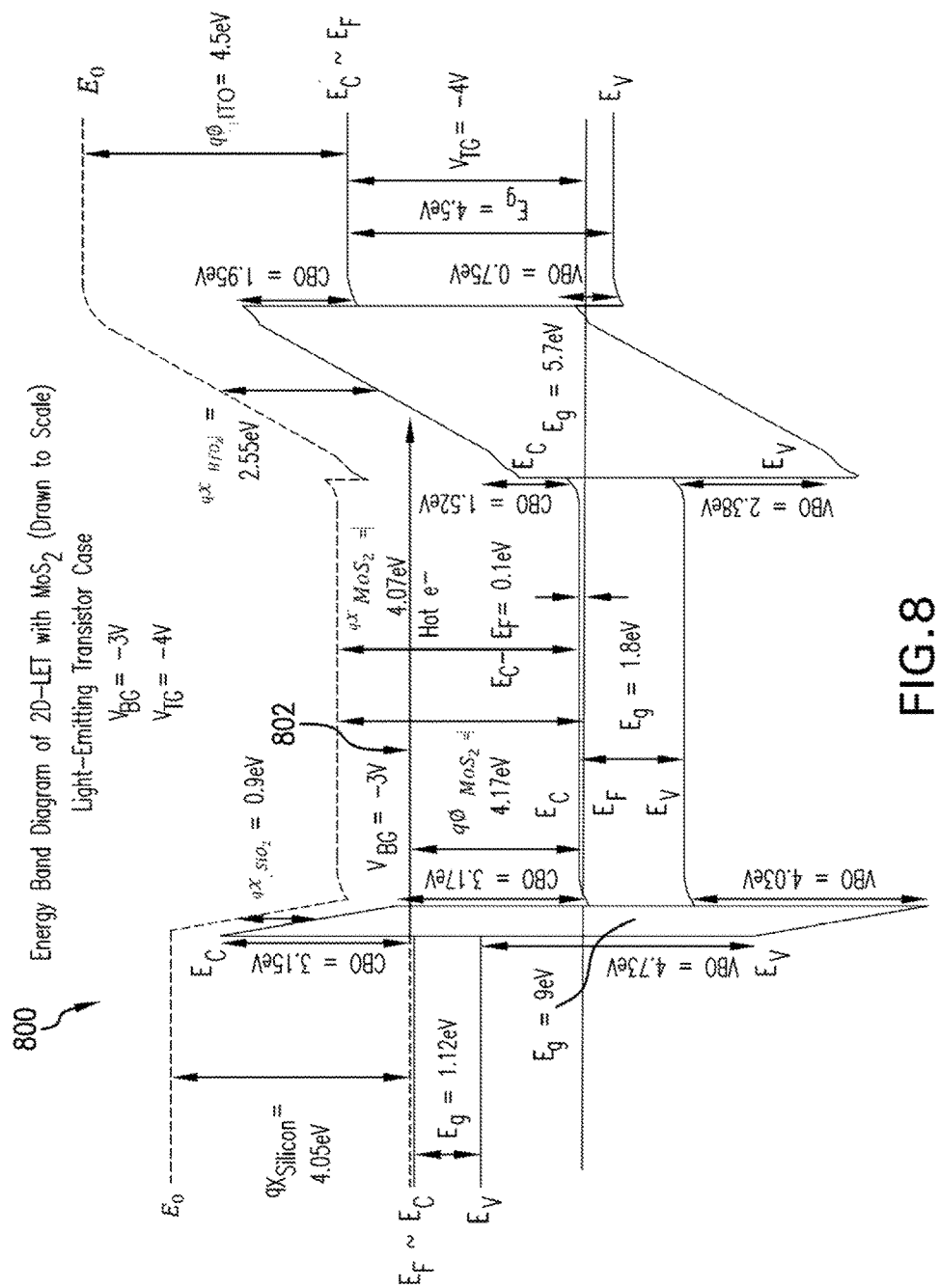
FIG. 8 illustrates an energy band diagram of a 2D-LET with MoS$_2$ as the active (e.g. base) region under biasing conditions where the device operates as a light-emitting transistor in accordance with aspects of the present invention.

FIG. 8 illustrates an energy band diagram 800 of optoelectronic device 100 with $MoS_2$ as the active (e.g. base) region under biasing conditions where the device operates as a light-emitting transistor in accordance with aspects of the present invention.

Energy band diagram 800 shows the energy band diagram of optoelectronic device 100 when using $MoS_2$ as the material for semiconducting material 116 when $V_{BG}$ 110 is applied with a voltage of −3 Volts and $V_{TG}$ 108 has a voltage of −4 Volts. Additionally, energy band diagram 800 shows all of the relevant material parameters which include band gaps, electron affinities, work functions, conduction band offsets, and valence band offsets. Degenerately doped ITO is used as the material for collector 112 in this embodiment of optoelectronic device 100. Line 802 indicates the vertically tunneling hot electrons which are injected from substrate 120 into conduction band of semiconducting material 116 through tunneling barrier 118. However, in this case, the potential barrier (e.g., filter barrier at the base-collector interface) is raised with an applied negative $V_{TG}$ ($V_{TG}$<0) 108. Hence, the hot electrons are back-scattered into the base region (e.g., semiconducting material 116) and relax to its conduction band edge and eventually emit photons at a wavelength corresponding to the bandgap of $MoS_2$ or lower due to its reduction via the giant Stark Effect. This mode of operation of optoelectronic device 100 enables voltage-tunable wavelength-agile light-emission from 2D materials with direct bandgaps.

A method of emitting light in accordance with aspects of the present invention will now be described with reference to FIG. 9.

Figure 9:
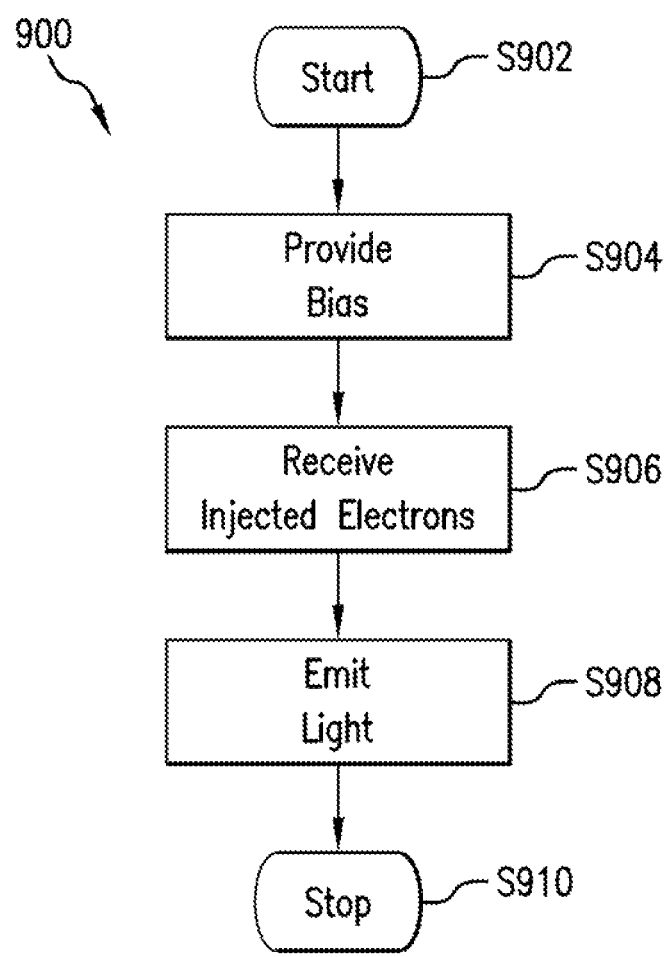
FIG. 9 illustrates a method of emitting light using an optoelectronic device in accordance with aspects of the present invention.

FIG. 9 illustrates a method 900 of emitting light using optoelectronic device 100 in accordance with aspects of the present invention.

As shown in the figure, method 900 starts (S902) and a bias is provided (S904). For example, returning to FIG. 2A, $V_{BG}$ 110 is applied and $V_{TG}$ 108 is applied.

Returning to FIG. 9, after the bias is provided (S904), the injected electrons are received (S906). For example, returning to FIG. 2A, hot electrons are injected from substrate 120 through tunneling barrier 118 and into semiconductor layer 116.

Returning to FIG. 9, after the injected electrons are received (S906), light is emitted (S908). For example, returning to FIG. 2A, semiconductor layer 116 emits light 206.

Returning to FIG. 9, after the light is emitted (S908), method 900 stops (S910).

A method of detecting light in accordance with aspects of the present invention will now be described with reference to FIG. 10.

Figure 10:
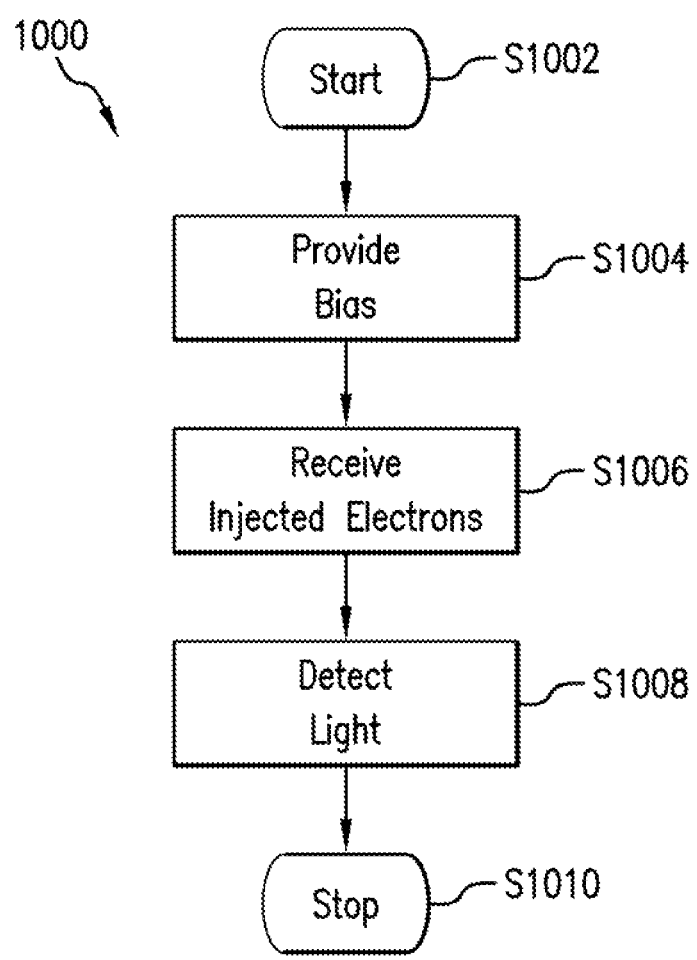
FIG. 10 illustrates a method of detecting light using an optoelectronic device in accordance with aspects of the present invention.

FIG. 10 illustrates a method 1000 of detecting light using optoelectronic device 100 in accordance with aspects of the present invention.

As shown in the figure, method 1000 starts (S1002) and a bias is provided (S1004). For example, returning to FIG. 2B, $V_{BG}$ 110 is applied and $V_{TG}$ 108 is applied.

Returning to FIG. 10, after the bias is provided (S1004), the injected electrons are received (S1006). For example, returning to FIG. 2B, hot electrons are injected from substrate 120 through tunneling barrier 118 and into semiconductor layer 116.

Returning to FIG. 10, after the injected electrons are received (S1006), light is detected (S1008). For example, returning to FIG. 2B, semiconductor layer 116 receives light 208. The photons of light 208 are then absorbed by electrons within substrate 120 or semiconductor layer 116, or both depending on the incident photon energy. As mentioned previously, since the value of $V_{BG}$ 110 is constant, the extra electrons travelling to ground due to their absorption of the photons of light 208 will result in a change in current. In this manner, any change in current may be used to determine whether or not light has been detected by optoelectronic device 100.

Returning to FIG. 10, after the light is detected (S1008), method 1000 stops (S1010).

In accordance with aspects of the present invention, a light-emitting transistor based on 2D materials (2D-LET) and ion-gel top-gate dielectrics enables voltage-controlled wavelength-agile light emission spanning from the visible to the mid-infrared spectrum at room temperature. The active regions of the 2D-LETs feature monolayer 2D semiconductors with direct bandgaps (e.g. $MoS_2$, $WSe_2$, etc.) in the visible or near-infrared spectral range which correspond to a well-defined wavelength of light emission due to interband luminescence. Furthermore, the wavelength of the light emitted from the 2D-LETs can be voltage-tuned to the mid-infrared by the in-situ reduction of their inherent direct bandgaps via the electric dipole layer enhanced giant Stark Effect (e.g. a perturbing perpendicular electric field). The 2D-LET is a novel device concept that exploits the direct bandgaps and high quantum efficiencies of monolayer 2D semiconductors known as the transition metal dichalcogenides (TMDs).

The direct bandgaps and the associated van Hove singularities in the density of states of these novel monolayer TMDs lead to an enhanced light absorption (~10% incident photon absorption per monolayer TMD) compared to other atomic-layered materials such as graphene (~2.3% incident photon absorption per monolayer graphene). Furthermore, this 2D-LET device concept exploits the large capacitances (~10 μFcm^-2) and electric fields inherent in ion-gels (e.g. a gel polymer electrolyte that results from the cross-linking of an ionic liquid and a polymer matrix) which exist in the vicinity of a sub-nanometer thick electric dipole layer at the surface of the 2D material. A top-gate voltage across this ion-gel can induce a much larger and efficient spectral shift in the direct bandgaps of the 2D semiconductor material in the active (e.g. base) region of the 2D-LET at lower applied voltages compared to a 2D-LET based on conventional high dielectric constant (high-k) top-gate dielectrics such as $HfO_2$.

Some advantages of the 2D-LET offered by the implementation of the ion-gel top-gate dielectric include: a high specific capacitance ($C_{EDL}$~10 μF cm$^{-2}$) due to the confinement of the electric field to an electric dipole layer (<1 nm thick) near the 2D material's surface; a greater Stark Effect and hence a larger wavelength tuning capability of photon emission from the 2D semiconductors due to the stronger perturbing electric fields near the surface of the 2D material; the possibility of flexible and low-voltage (e.g. <3V) operation compared to 2D-LETs without ion-gels; the possibility of higher on-state (ION) drive currents and transparency to the emitted light; an enhanced amount of carrier concentration (e.g. doping) induced in the 2D material by over an order of magnitude (n>$10^{14}$ cm$^{-2}$) compared to using conventional top-gate dielectrics such as $HfO_2$ and $Al_2O_3$; a lower (e.g. Ohmic) contact resistance to 2D semiconductors due to this higher induced carrier concentration in the 2D material (e.g. screen/reduce the Schottky barrier); and light emission at higher frequencies (e.g. visible) from graphene with an ion-gel top-gate dielectric since the Fermi level can be shifted much farther into the valence band of graphene (e.g. $|E_F|>1.2$ eV with ion-gel compared to 0.5 eV without ion-gel).

The 2D-LET has the potential to enable CMOS-compatible, scalable, wavelength-tunable broadband light sources from a monolayer 2D semiconductor material and/or their atomically-layered heterostructures. The photon emission wavelength can be tuned from the visible to the mid-infrared regions of the electromagnetic spectrum by applying a top-gate voltage across a suitable top-gate dielectric (e.g. high-k dielectric or an ion-gel) with a high enough dielectric strength to avoid dielectric breakdown. 2D-LET could serve as a low-optical power light source in combination with a vertically displaced graphene or other monolayer 2D semiconductor (e.g. or their heterostructures) photodetector for optical signal routing, optical interconnect, hybrid 2D material/3D bulk silicon chipscale integrated photonics applications. The 2D-LET is a unique concept in that it differs from the typical LEDs, in which p-n junction diodes serve as the active area of the device for light emission. 2D-LET does not feature a p-n junction diode and the light emission is possible by the physical phenomena of hot electron luminescence (e.g. the recombination of hot electrons with available empty valence band states in the monolayer 2D semiconductor quantum well itself) of hot carriers which are vertically injected into these atomic-scale quantum wells (e.g. ~0.65 nm thick) via quantum tunneling. This is a radiative recombination mechanism in the 2D semiconductor itself and depends upon the carrier density and kinetic energy of the injected hot electrons as well as the relative magnitude of the 2D semiconductor's varying direct bandgap, which are all controlled by the applied voltage-biases.

Finally, it is worth mentioning that in theory the 2D-LET is capable of terahertz (THz) electronic switching when operated in the hot electron transistor mode due to the fact that it relies on quantum tunneling (e.g. femtosecond timescales) and the base transit time is through an atomically thin quantum well. The physically limited (e.g. realistic) cutoff frequency will depend on future optimization of the 2D-LET device design, structure, material parameters (e.g. barrier heights and thicknesses), material hetero-interface quality, reduction of parasitic resistances and capacitances, etc.

This device may be made using variations of materials for the underlying substrate, dielectrics (e.g. back-gate tunneling dielectric and top-gate dielectric), the chosen 2D material and/or their atomic-scale heterostructures in the active region, and the electrodes. One embodiment of the 2D-LET implements a high-k dielectric such as $HfO_2$ for the top-gate dielectric which features a capacitance up to $\sim 3\times 10^{-7}$ F $cm^{-2}$, a maximum Fermi-level shift from the Dirac point in graphene of $|E_F|\sim 0.5$ eV, and a maximum induced carrier density of $n\sim 1\times 10^{13}$ $cm^{-2}$.

Another embodiment of the 2D-LET implements an ion-gel (e.g. gel polymer electrolyte) for the top-gate dielectric and contact which features a capacitance up to $\sim 1\times 10^{-5}$ F $cm^{-2}$, a maximum Fermi-level shift from the Dirac point of graphene of $|E_F|>1.2$ eV, and a maximum induced carrier density of $n>1\times 10^{14}$ $cm^{-2}$.

Both of the aforementioned embodiments could implement various top-gate electrodes such as a transparent conducting oxide (e.g. but not limited to ITO), large area monolayer CVD graphene, or the ion-gel could simply be non-locally probed without the need for a defined top-gate electrode. Selecting the proper dielectric materials and their thicknesses can optimize the amount of bias voltage needed to operate (e.g. emit light) at a specific wavelength.

Furthermore, an analogous hot-hole device could also be constructed by implementing a highly p-doped substrate and reversing the polarity of the applied biases. In addition, one could inject hot-holes into an n-type 2D semiconductor or hot-electrons into a p-type semiconductor. Additionally, the active (e.g. base) region of the 2D-LET can consist of 2D material-based heterostructures featuring 2D transparent electrodes or electron/hole injectors (e.g. graphene), 2D insulating tunnel barriers (e.g. hexagonal boron nitride), and 2D semiconductors (e.g. $MoS_2$, $WS_2$, $WSe_2$, $MoSe_2$, etc.) as light-emitting atomic-scale quantum wells.

This heterostructure in the base region could be perturbed by the exceptionally strong electric field due to the ion-gel top-gate dielectric and hence this embodiment of the 2D-LET could yield predetermined custom-designed multiple bandgap luminescence linewidths which could all simultaneously be spectrally shifted via the giant Stark Effect at room temperature for parallel communication channels.

Another embodiment features a flexible version of the 2D-LET by transferring the large-area 2D material based heterostructures onto a flexible and transparent substrate such as polyethylene terephthalate (PET). In this case, graphene could serve as the hot electron injector (e.g. emitter electrode) as well as the transparent collector electrode, with the ion-gel acting as the flexible and transparent top-gate dielectric which rests on top of the 2D material-based heterostructure (e.g. base region) for an all transparent and flexible 2D-LET device architecture for future military applications.

Another embodiment features the monolayer 2D semiconductor material to include multiple monolayers of direct bandgap monolayer 2D semiconductor material.

In summary, the present invention uses a system and method to introduce a novel light-emitting transistor based on 2D materials and ion-gel top gate dielectrics that shall enable voltage controlled wavelength agile light emission spanning from the visible to the mid-infrared spectrum at room temperature. The optoelectronic device features a 2D monolayer semiconductor with direct band gaps in the visible to near-infrared spectral range which correspond to a well-defined wavelength of light emission due to interband luminescence.

Further, the wavelength of the light emitted from the optoelectronic device can be voltage-tuned to the mid-infrared by the dynamic reduction of their inherent bandgaps via the electric dipole layer enhanced giant Stark Effect.

The foregoing description of various preferred embodiments have been presented for purposes of illustration and description. It is not intended to be exhaustive or to limit the invention to the precise forms disclosed, and obviously, many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A semiconducting optoelectronic device comprising:
   a doped substrate disposed on an X-Y plane;
   a tunneling barrier disposed on said substrate;
   a direct bandgap two dimensional semiconductor material disposed on said tunneling barrier in a second X-Y plane; and
   a top-gate voltage source arranged to provide a voltage bias in a direction normal to the second X-Y plane so as to generate an electric field perpendicular to said direct bandgap two dimensional semiconductor material,
   wherein said doped substrate acts as a hot electron emitter to inject electrons through said tunneling barrier and into said direct bandgap two dimensional semiconductor material, and
   wherein the voltage bias provided by said top-gate voltage source is operable to change an optical bandgap of said direct bandgap two dimensional semiconductor material via a giant Stark Effect.

2. The semiconducting optoelectronic device of claim 1, wherein said direct bandgap two dimensional semiconductor material comprises a direct bandgap monolayer two dimensional semiconductor material, and
   wherein said top-gate voltage source is optically transparent.

3. The semiconducting optoelectronic device claim 2, wherein said top-gate voltage source comprises a material selected from the group consisting of indium tin oxide, ion-gel, ionic-liquid, graphene and combinations thereof.

4. The semiconducting optoelectronic device of claim 3, wherein said direct bandgap monolayer two dimensional semiconductor material comprises a material selected from the group consisting of $MoS_2$, $WS_2$, $WSe_2$, other transition metal dichalcogenides, black phosphorous, and combinations thereof.

5. The semiconducting optoelectronic device of claim 4, wherein said doped substrate comprises silicon doped with $n^{++}$.

6. The semiconducting optoelectronic device of claim 5, wherein said direct bandgap monolayer two dimensional semiconductor material comprises multiple monolayers of direct bandgap monolayer two dimensional semiconductor material.

7. The semiconducting optoelectronic device claim 1, wherein said top-gate voltage source comprises a material selected from the group consisting of indium tin oxide, ion-gel, ionic-liquid, graphene and combinations thereof.

8. The semiconducting optoelectronic device of claim 7, wherein said direct bandgap two dimensional semiconductor material comprises a material selected from the group consisting of $MoS_2$, $WS_2$, $WSe_2$, other transition metal dichalcogenides, black phosphorous, and combinations thereof.

9. The semiconducting optoelectronic device of claim 8, wherein said doped substrate comprises silicon doped with $n^{++}$.

10. The semiconducting optoelectronic device of claim 9, wherein said direct bandgap two dimensional semiconductor material comprises multiple monolayers of direct bandgap two dimensional semiconductor material.

11. The semiconducting optoelectronic device of claim 1, wherein said direct bandgap two dimensional semiconductor material comprises a material selected from the group consisting of $MoS_2$, $WS_2$, $WSe_2$, other transition metal dichalcogenides, black phosphorous, and combinations thereof.

12. The semiconducting optoelectronic device of claim 11, wherein said doped substrate comprises silicon doped with $n^{++}$.

13. The semiconducting optoelectronic device of claim 12, wherein said direct bandgap two dimensional semiconductor material comprises multiple monolayers of direct bandgap two dimensional semiconductor material.

14. The semiconducting optoelectronic device of claim 1, wherein said doped substrate comprises silicon doped with $n^{++}$.

15. The semiconducting optoelectronic device of claim 14, wherein said direct bandgap two dimensional semiconductor material comprises multiple monolayers of direct bandgap two dimensional semiconductor material.

16. The semiconducting optoelectronic device of claim 1, wherein said direct bandgap two dimensional semiconductor material comprises multiple monolayers of direct bandgap two dimensional semiconductor material.

17. The semiconducting optoelectronic device of claim 16, wherein said direct bandgap two dimensional semiconductor material disposed on said tunneling barrier in a second X-Y plane and is operable to emit light when said doped substrate injects electrons through said tunneling barrier and into said direct bandgap two dimensional semiconductor material.

18. The semiconducting optoelectronic device of claim 1, wherein said direct bandgap two dimensional semiconductor material disposed on said tunneling barrier in a second X-Y plane is operable to detect light when said doped substrate injects electrons through said tunneling barrier and into said direct bandgap two dimensional semiconductor material.

19. A method of emitting light, said method comprising:
providing a semiconducting optoelectronic device comprising:
  a doped substrate disposed on an X-Y plane;
  a tunneling barrier disposed on the substrate;
  a direct bandgap two dimensional semiconductor material disposed on the tunneling barrier in a second X-Y plane; and
  a top-gate voltage source arranged to provide a voltage bias in a direction normal to the second X-Y plane so as to generate an electric field perpendicular to the direct bandgap two dimensional semiconductor material,
  wherein the doped substrate acts as a hot electron emitter to inject electrons through the tunneling barrier and into the direct bandgap two dimensional semiconductor material,
  wherein the voltage bias provided by the top-gate voltage source is operable to change an optical bandgap of the direct bandgap two dimensional semiconductor material via a giant Stark Effect;
providing the voltage bias, via the top-gate voltage source, so as to generate an electric field perpendicular to the direct bandgap two dimensional semiconductor material;
injecting, via the doped substrate, electrons through the tunneling barrier and into the conduction band of the direct bandgap two dimensional semiconductor material; and
emitting light from the direct bandgap two dimensional semiconductor material.

20. A method of detecting light, said method comprising:
providing a semiconducting optoelectronic device comprising:
  a doped substrate disposed on an X-Y plane;
  a tunneling barrier disposed on the substrate;
  a direct bandgap two dimensional semiconductor material disposed on the tunneling barrier in a second X-Y plane; and
  a top-gate voltage source arranged to provide a voltage bias in a direction normal to the second X-Y plane so as to generate an electric field perpendicular to the direct bandgap two dimensional semiconductor material,
  wherein the doped substrate acts as a hot electron emitter to inject electrons through the tunneling barrier and into the conduction band of the direct bandgap two dimensional semiconductor material,
  wherein the voltage bias provided by the top-gate voltage source is operable to change an optical bandgap of the direct bandgap two dimensional semiconductor material via a giant Stark Effect;
providing the voltage bias, via the top-gate voltage source, so as to generate an electric field perpendicular to the direct bandgap two dimensional semiconductor material;
injecting, via the doped substrate, electrons through the tunneling barrier and into the conduction band of the direct bandgap two dimensional semiconductor material; and
receiving light into at least one of the direct bandgap two dimensional semiconductor material and the substrate.

* * * * *